United States Patent [19]

Gaskell et al.

[11] 3,961,256

[45] June 1, 1976

[54] LIGHT-EMITTING SEMICONDUCTOR DISPLAY APPARATUS FOR DISPLAYING A BAND REPRESENTATION OF A VOLTAGE ANALOG OF A MEASURED PARAMETER

[75] Inventors: Colin Simister Gaskell, Waresley; Rory Morgan O'Brien, Weston, both of England

[73] Assignee: Alfred Herbert Limited, Coventry, England

[22] Filed: Oct. 10, 1974

[21] Appl. No.: 513,944

[30] Foreign Application Priority Data

Oct. 17, 1973 United Kingdom............... 48453/73

[52] U.S. Cl.................................... 324/96; 324/122
[51] Int. Cl.²................. G01R 31/00; G01R 13/02; G01R 19/16
[58] Field of Search...................... 324/96, 122, 115; 340/266

[56] References Cited
UNITED STATES PATENTS

| | | | |
|---|---|---|---|
| 3,732,539 | 5/1973 | Easterly............................... | 340/266 |
| 3,786,352 | 1/1974 | Woods et al......................... | 324/115 |
| 3,795,863 | 3/1974 | Umeda et al. ....................... | 324/96 |

OTHER PUBLICATIONS

Kal'nin et al., "Application of Light–Emitting Diode Matrices in Measurement Engineering," Instrum. & Exp. Tech., Jan.–Feb. 1972, pp. 163–164.

Read, Jr., S., "A Neon Type Volume Indicator," Jr. of the Soc. of Motion Picture Engineers, 6–1937, pp. 636–637.

*Primary Examiner*—John K. Corbin
*Assistant Examiner*—Wm. H. Punter
*Attorney, Agent, or Firm*—Haseltine, Lake & Waters

[57] ABSTRACT

Display apparatus receives from a transducer a voltage analogue signal representing the parameter to be measured and uses the signal to produce an illuminated band-representation of the parameter by a series of semiconductor light emission devices. A zero value of the analogue signal is represented by a band terminating intermediate the ends of the series so that positive and negative analogue values are measured, and it is indicated, for example by flashing the illuminated band on and off, when the analogue value exceeds predetermined positive and negative tolerance limits which are both within the measuring range of the apparatus, the indication being such as to draw an operator's attention to the displayed out-of tolerance value.

16 Claims, 1 Drawing Figure

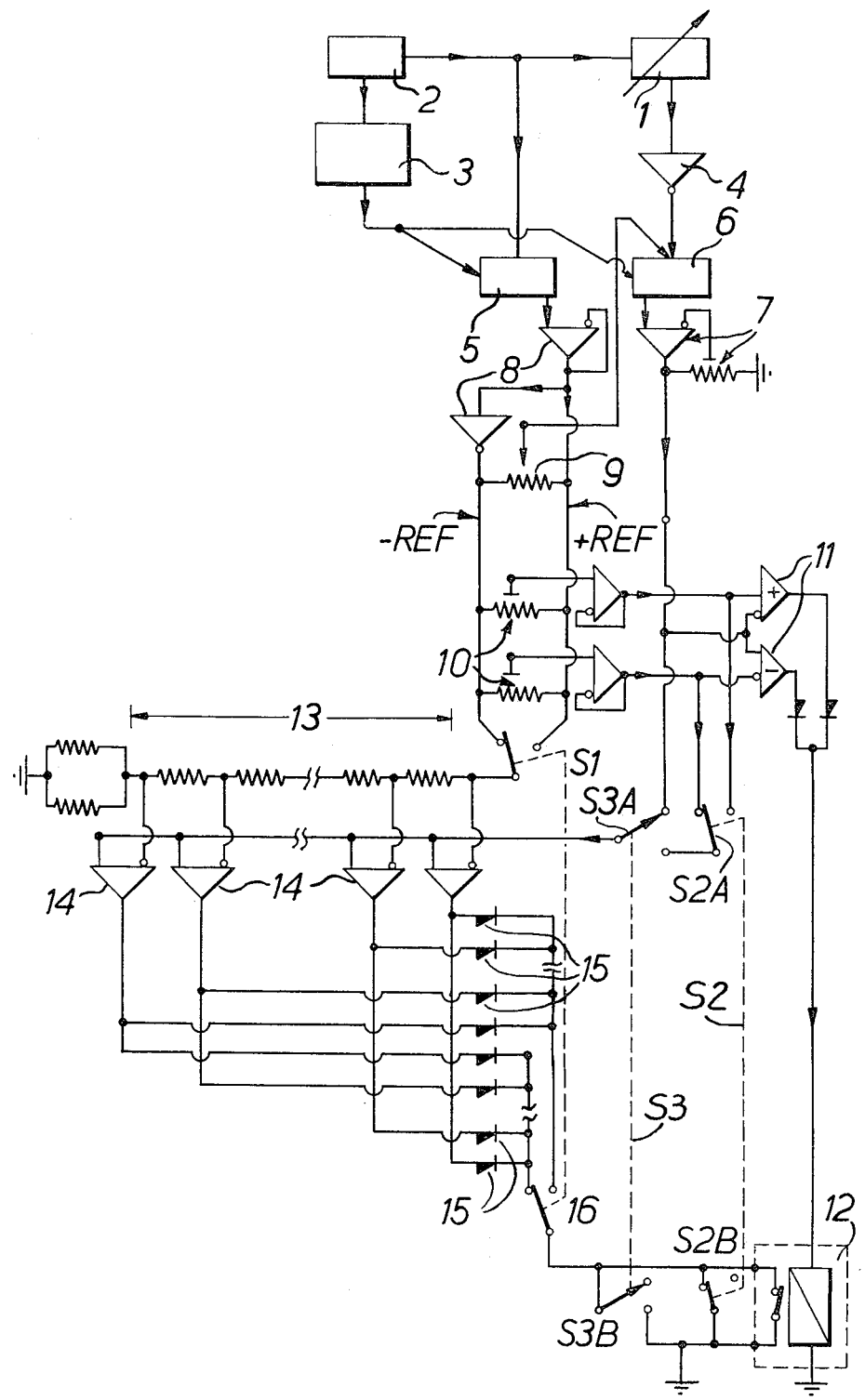

LIGHT-EMITTING SEMICONDUCTOR DISPLAY APPARATUS FOR DISPLAYING A BAND REPRESENTATION OF A VOLTAGE ANALOG OF A MEASURED PARAMETER

The invention relates to light emitting semiconductor display apparatus for displaying a band representation of a voltage analog of a measured parameter.

According to the invention, there is provided metrology apparatus, for use in conjunction with a transducer and an electrical circuit which together form a voltage analogue of a parameter to be measured, for providing a visual display of the value of the analogue and hence of the parameter, the apparatus comprising a series of semiconductor light emission devices, a terminal for receiving said voltage analogue, and electrical circuitry connected to said terminal and to said devices for causing the devices to emit light in such manner that they provide a band representation of the value of said analogue with a zero value of the analogue being represented by a band terminating intermediate the ends of the said series, and for causing the nature, other than merely the length of the band, of said representation to become visually different if the value of said analogue is not within a predetermined tolerance range.

The electrical circuit which, with the transducer, forms a voltage analogue of the parameter to be measured may be supplied as part of, and included in, the apparatus while the transducer may be supplied separately being disconnectible from the apparatus.

Preferably, a zero value of the analogue is represented by a band of light terminating at the centre of the series of devices thus giving a "centre zero" display.

Preferably said electrical circuitry comprises means for forming a series of different reference voltages, and a series of comparators each having one input connected to receive a respective one of the reference voltages, another input connected to said terminal, and an output connected to control the devices. The reference voltage forming means may comprise a series resistor chain.

When the value of said analogue is not within the predetermined tolerance range, the representation might, for example, flash on and off repeatedly. For this, said electrical circuitry may comprise means for detecting that the value of the analogue is not within the tolerance range and two switches connected in parallel and so as to control the flow of electrical current through said devices, one of the switches being continuously opened and closed in succession during use of the apparatus and the other being connected to be controlled by the detecting means and being closed when the analogue is within said tolerance range. The said detecting means may comprise a pair of comparators each having one input connectible to receive a respective tolerance range limit voltage, another input connected to said terminal, and an output connected to control said other switch.

Advantageously, said circuitry comprises multiplexing means. For example, said devices may be arranged in two groups, the output of each comparator in said series thereof being connected to control one device in each group, and there can be switching means for causing said reference voltage forming means to alternately and repeatedly form first one and then another series of reference voltages and for causing it to be alternately and repeatedly possible for the devices of first one and then the other group of devices to emit light.

The voltage analogue forming circuit, when present, will comprise an input for connection to said transducer and an output connected to said terminal. Preferably, this voltage analogue forming circuit comprises an oscillator having an output available for connection to said transducer, and sampling means for sampling the oscillator output signal which is received at the analogue forming circuit input via the transducer during use of the apparatus, and for supplying at said terminal a direct-current signal representative of the oscillator output signal as received via the transducer. There may be further sampling means which is connected to receive the oscillator output signal directly, to sample it and to supply a direct current signal which is fed so as to determine said series of reference voltages. Preferably, there is inverting and buffering circuitry for forming from the output of the further sampling means a positive reference voltage and a negative reference voltage which are fed along two respective conductors to said switching means which selects these voltages alternately and repeatedly and supplies the selected voltage to said resistor chain. Two potentiometers may each be connected between said two conductors for forming said tolerance range limit voltages.

Preferably, said semiconductor light emission devices comprise light emitting diodes.

In order to set the tolerance limits, it is desirable to have some method of displaying both upper and lower limits simultaneously. It is optionally possible to do this by using the three different modes of display (dark, flashing lights or steady lights) to define the zones of above tolerance, in tolerance and below tolerance. The actual tolerance limits will then be clearly indicated at the two junctions of these zones. Alternatively, the in-tolerance zone could be defined by a solid band of light, both the out-of-tolerance zones being dark.

DETAILED DESCRIPTION

For a better understanding of the invention and to show how the same may be carried into effect, reference will now be made, by way of example, to the accompanying drawing, the single FIGURE of which comprises a simplified circuit diagram of one embodiment of the invention.

The apparatus may conveniently be used in conjunction with a differential inductance transducer 1 which comprises an inductor having a displaceable core. The transducer is arranged so that the position of its core is affected by a parameter to be measured, e.g. a physical dimension of some manufactured article, and the inductance value of the transducer is thereby affected by that parameter. The transducer is connected in a bridge circuit which produces a voltage analogue of the parameter. An oscillator 2 excites the transducer 1 at about 10 KHZ and also drives a pulse generator 3 which produces a short pulse at each peak of the oscillator waveform. This controls a first sampling circuit 5 which samples the oscillator voltage at intervals determined by the pulse generator and produces a DC reference output proportional to the oscillator amplitude. A second sampling circuit 6 produces a DC output proportional to the core displacement of the transducer 1. The reference output from 5 is buffered and inverted at 8 to produce positive and negative reference signals. These signals are fed through switch S1 to become driving voltages for a resistor chain 13 which produces a series of reference voltages differing by equally spaced steps as the inputs to a series of comparators 14. The comparator outputs drive two chains of light emitting diodes 15, each comparator driving one diode in each chain. The diodes are arranged to form a column light display with one chain of diodes forming the upper half of the column and the other chain forming the lower half. The two diode chains are grounded in turn through switch 16, which is switched in synchronism with S1 at 50Hz, and through the normally closed contact on a relay 12. Because of this multiplexing arrangement in which each comparator drives two of the diodes on a time division basis the number of comparators 14 needed only has to be half the number of diodes 15.

The analogue signal from discriminator 6 is fed through an amplifier and magnification control 7 to the second inputs of all the comparators 14. Thus, those comparators 14 whose reference voltage is below the signal voltage will have a high output, and will illuminate the relevant diode. All others will have a low output, and the associated diodes will be extinguished. The two diodes which are associated with the comparator receiving the lowest reference voltage magnitude are at the centre of the column — thus the display has a "centre zero".

The upper and lower tolerance limits are set at the potentiometers 10. The voltages appearing at the moving contacts of these potentiometers are buffered and are compared with the analogue by limit comparators 11. While the analogue remains between the tolerance limits, a relay 12 is not energised and the light emitting diode chains are grounded as aforesaid through its normally closed contact. If the analogue goes out of tolerance, this contact opens, and the lights are caused to flash through the action of one contact set—, and after "S2B" insert—of a switch S2 which also comprises a ganged contact set S2A and S2B which is opened and closed at a rate of a few Hertz (typically 4Hz).

The tolerancing setting facility is activated by switching switch S3 comprising ganged contact sets S3A and S3B to "set" position. S3B then shorts out S2B and the contact of the relay 12. This disables the normal out of tolerance indication and S3A connects the comparator chain input to S2A. S2A is switched at a few Hertz (typically 4Hz) between the high and low limit values. The effect of this is that all diodes below the low limit are illuminated for one half of the 4Hz switch cycle, and all diodes below the upper limit (including those below the lower limit) are illuminated for the other half cycle. Thus the diodes below the low limit appear to be continuously illuminated, those between the two limit values flash at the switching rate, and those above the upper limit are not illuminated. The limit points are thus clearly indicated.

It will be appreciated that switch contacts S1 and S2 to the comparator inputs can conveniently be formed by field effect transistors suitably buffered, while the contacts of the switches which are used to ground the light emitting diode chains can be formed from transistors.

It will be seen that in the embodiment described, the output level of the oscillator 2 does not effect the displayed measurement because the oscillator output is used not only to excite the transducer 1 but also to form the reference voltages fed to the comparator chains.

The apparatus may be housed in a housing unit with the series of LED.s forming a column display visible from say the front of the housing unit. The housing unit may then be arranged in conjunction with other similar units to supply displays of several parameters to be measured.

We claim:

1. Apparatus for use in conjunction with means for forming a voltage analog of a parameter to be measured, for providing a visual display of the value of the analog and hence of the parameter, said apparatus comprising a series of semiconductor light emission means, a conductor portion for receiving said voltage analog, and electrical circuitry including a plurality of resistors for forming a series of different reference voltages and comparator means operable to compare said voltage analog with said reference voltages and to cause the light emission means to emit light whereby they provide a band representation of the value of said analog with a zero value of the analog being represented by a band terminating intermediate the ends of the said series, said circuitry further including means for forming two signals respectively defining the upper and lower limits of a predetermined tolerance range for said analog, both said upper and lower tolerance range limits being intermediate the limits of the range of measurement of the apparatus, further comparator means operable for determining when said analog is outside said tolerance range limits, and means which is connected to be controlled by said further comparator means and which becomes operable, when said anlog is outside said tolerance range limits as aforesaid, to produce a marked visible change in the nature of said representation while the value of the analog is still being displayed, in such a way that the operator's attention is drawn to the displayed value.

2. Apparatus according to claim 1, wherein a zero value of said analogue is represented by a band terminating at the center of said series of devices.

3. Apparatus according to claim 1, wherein said semiconductor light emission means comprise light emitting diodes.

4. Apparatus according to claim 1, including means for visually displaying the tolerance range limits.

5. Apparatus according to claim 4, wherein the tolerance range limit displaying means comprises switching means by use of which the normal analogue display function of the apparatus can be disabled, the light emission means associated with analogue values less than the lower tolerance range limit can be made to be lit continuously, the light emission means associated with analogue values within the tolerance range can be made to flash on and off repeatedly and the light emission means associated with analogue values greater than the higher tolerance range limit can be made to remain unlit.

6. Apparatus according to claim 1, wherein said comparator means comprises a series of comparators each having one input connected to receive a respective one of the reference voltages, another input connected to said conductor portion, and an output connected to control the devices.

7. Apparatus according to claim 6, wherein said plurality of resistors are connected to form a series resistor chain.

8. Apparatus according to claim 6, wherein said light emission means are arranged in two groups, the output of each comparator in said series thereof is connected to control one light emission means in each group, and wherein there are switching means for causing said plurality of resistors to alternately and repeatedly form first one and then another series of reference voltages and for causing it to be alternately and repeatedly possible for the light emission means of first one and then the other group of light emission means to emit light.

9. Apparatus according to claim 6, wherein said circuitry comprises multiplexing means.

10. Apparatus according to claim 1, wherein, when said analog is outside said tolerance range limits, the representation flashes on and off repeatedly.

11. Apparatus according to claim 10, wherein said means which is operable to produce a change in the nature of said representation comprises two switches connected in parallel and so as to control the flow of electrical current through said devices, one of the switches being continuously opened and closed in succession during use of the apparatus and the other being connected to be controlled by said further comparator means and being closed when the analog is within said tolerance range.

12. Apparatus according to claim 11, wherein said further comparator means comprises a pair of comparators each having one input connected to receive a respective one of said tolerance range limit signals, another input connected to said conductor portion, and an output connected to control said other switch.

13. A combination of display apparatus according to claim 1, and the said means for forming a voltage analog of a parameter to be measured, said voltage analog forming means comprising a transducer, an oscillator having an output connected to said transducer, and sampling means which is connected to said transducer and to said conductor portion and which is operable for sampling the oscillator output signal received by the sampling means via the transducer and for supplying to said conductor portion a direct-current signal representative of the oscillator output signal as received via the transducer.

14. The combination according to claim 13, wherein said comparator means comprises a series of comparators each having one input connected to receive a respective one of the said reference voltages, another input connected to said conductor portion, and an output connected to control the light emission means, the analog voltage forming means including further sampling means which is connected to receive the said oscillator output signal directly, to sample it and to supply a direct current signal to said plurality of resistors so as to determine the values of the said reference voltages.

15. The combination according to claim 14, wherein said plurality of resistors are connected to form a series resistor chain, and wherein said light emission means are arranged in two groups, the output of each comparator in said series thereof being connected to control one light emission means in each group, the apparatus including inverting and buffering circuitry for forming from the output of the further sampling means a positive reference voltage and a negative reference voltage, first switching means connected to receive said positive and negative reference voltages via two respective conductors and constructed for alternately and repeatedly selecting first one and then the other of said positive and negative reference voltages and feeding the selected voltage to said resistor chain whereby the resistor chain alternately and repeatedly forms first one and then another series of reference voltages, and second switching means for causing it to be alternately and repeatedly possible for the light emission means of first one and then the other group of light emission means to emit light.

16. The combination according to claim 15, wherein said further comparator means comprises a pair of comparators each having two inputs and an output, said means for forming two tolerance range limit signals comprises two potentiometers each connected between said two conductors for forming respective tolerance range limit voltages, and the said means which is operable to produce a change in the nature of said representation comprises flashing switch means for causing said band to flash on and off repeatedly, one input of each of said pair of comparators being connected to a respective one of the two potentiometers, the other input of each of said pair of comparators being connected to said conductor portion, and the outputs of said pair of comparators being connected to control said flashing switch means.

* * * * *